US011379330B2

(12) United States Patent
Chaiken et al.

(10) Patent No.: US 11,379,330 B2
(45) Date of Patent: Jul. 5, 2022

(54) INFORMATION HANDLING SYSTEMS AND RELATED METHODS FOR TESTING MEMORY DURING BOOT AND DURING OPERATING SYSTEM (OS) RUNTIME

(71) Applicant: DELL PRODUCTS L.P., Round Rock, TX (US)

(72) Inventors: Craig L. Chaiken, Pflugerville, TX (US); Siva Subramaniam Rajan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 2 days.

(21) Appl. No.: 16/916,871

(22) Filed: Jun. 30, 2020

(65) Prior Publication Data
US 2021/0406143 A1  Dec. 30, 2021

(51) Int. Cl.
| *G06F 11/00* | (2006.01) |
| *G06F 11/22* | (2006.01) |
| *G06F 11/277* | (2006.01) |
| *G06F 11/10* | (2006.01) |
| *G06F 11/07* | (2006.01) |
| *G06F 11/30* | (2006.01) |
| *G06F 11/14* | (2006.01) |

(52) U.S. Cl.
CPC ........ *G06F 11/2284* (2013.01); *G06F 11/076* (2013.01); *G06F 11/0763* (2013.01); *G06F 11/0772* (2013.01); *G06F 11/1068* (2013.01); *G06F 11/1417* (2013.01); *G06F 11/277* (2013.01); *G06F 11/3037* (2013.01); *G06F 11/3058* (2013.01)

(58) Field of Classification Search
CPC ............... G06F 11/2284; G06F 11/076; G06F 11/0763; G06F 11/0772; G06F 11/1068; G06F 11/1417; G06F 11/277; G06F 11/3037; G06F 11/3058; G06F 11/0727; G06F 11/073; G06F 11/2278
See application file for complete search history.

(56) References Cited

U.S. PATENT DOCUMENTS

| 6,550,023 B1 * | 4/2003 | Brauch ................. G11C 29/40 714/42 |
| 2002/0105523 A1 * | 8/2002 | Behrbaum .......... G06F 12/0284 345/543 |

(Continued)

OTHER PUBLICATIONS

Dell, Reliable Memory Technology, "Detecting And Isolating Memory Errors", White Paper, Rev. 1.0, Apr. 2012, 6 pgs.

*Primary Examiner* — Joseph D Manoskey
(74) *Attorney, Agent, or Firm* — Egan, Enders & Huston LLP.

(57) ABSTRACT

Embodiments of information handling systems (IHSs) and computer-implemented methods are provided herein for testing system memory (or another volatile memory component) of an IHS. In the disclosed embodiments, memory testing is performed automatically: (a) during the pre-boot phase each time a new page of memory is allocated for the first time after a system boot, and (b) during OS runtime each time a read command is received and/or an event is detected. By proactively testing each page of memory, as the page is allocated but before information is stored therein, the systems and methods disclosed herein prevent "bad" memory pages from being used.

20 Claims, 6 Drawing Sheets

(56) References Cited

U.S. PATENT DOCUMENTS

| | | | |
|---|---|---|---|
| 2004/0181716 A1* | 9/2004 | Stern | G11C 29/56 |
| | | | 714/718 |
| 2009/0049270 A1* | 2/2009 | Khatri | G06F 11/1666 |
| | | | 711/203 |
| 2010/0023737 A1* | 1/2010 | Herzi | G06F 11/2284 |
| | | | 713/1 |
| 2010/0042629 A1* | 2/2010 | Fukatani | G06F 11/2289 |
| | | | 709/212 |

* cited by examiner

INFORMATION HANDLING SYSTEMS AND RELATED METHODS FOR TESTING MEMORY DURING BOOT AND DURING OPERATING SYSTEM (OS) RUNTIME

FIELD

This invention relates generally to information handling systems (IHSs), and more particularly, to IHS software and hardware components and related methods that may be used to test memory.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems (IHSs) typically include various types of computer readable memory, such as read only memory (ROM), random access memory (RAM), Flash memory, etc. In some cases, for example, an IHS may include system memory for storing program instructions and/or data, which is accessible and executable by host processor of the IHS. In some cases, the system memory may include a plurality of dual in-line memory modules (DIMMs), each containing one or more RAM modules mounted onto an integrated circuit board.

Memory errors and failures are a common cause for information handling system failures and often cannot be duplicated when the memory component is returned to the service center for repair. This makes it difficult to identify the cause of a system failure and which parts of the system may be faulty. In some cases, a failed memory component may be returned to the end user, or sent to another end user, if the memory failure couldn't be duplicated by the service center. This could result in an end user experiencing repeated memory failures.

Memory errors can be caused by any number of factors, such as temperature, age, defects, etc. Some memory errors, known as 'soft errors', randomly corrupt bits, but do not leave physical damage. Soft errors occur when one or more bits of memory spontaneously flip to the opposite state (e.g., when a bit flips from '1' to '0' when it should have remained a '1' during that memory cycle). These types of errors typically can be corrected via a memory refresh.

Other memory errors, known as 'hard errors', corrupt bits in a repeatable manner because of a physical defect or other anomaly within the memory itself, or when two soft errors occur within the same block of memory. A hard memory error may cause a system "crash" (requiring a reboot), or may cause applications to fail (generating a system-level Stop Error code, or a Blue Screen of Death, BSoD). Soft errors are often warning signs of impending hard errors.

Some information handling systems include Error-Correcting Code (ECC) memory and/or software algorithm(s) that may be used to detect memory failures. ECC memory includes extra memory bits and an on-board memory controller that can detect and correct single-bit errors. For example, ECC memory organizes a block of memory into rows and columns of bits and calculates the parity for each row and column. A single-bit error may be detected if the calculated parity of a row or a column of bits does not match the associated bit in the ECC data. If a single-bit error is detected, the ECC memory logic can toggle the associated bit to correct the single-bit error and output the corrected data so that the system continues to operate. However, ECC memory cannot correct hard errors or multi-bit errors that occur within the same block of memory.

The Reliable Memory Technology (RMT) algorithm is one example of a software algorithm, which may be used to detect hard errors and multi-bit soft errors in a memory component, such as a DIMM. When a memory error is detected, the RMT algorithm notes the error and the system is rebooted. Upon system reboot, the RMT algorithm maps the defective portion of the DIMM, reports the defect and the DIMM location to the Basic Input/Output Operating System (BIOS), and permanently blocks out areas of the DIMM that are deemed "bad" by removing the defective memory cells and a small amount of nearby cells from the system memory map, effectively "hiding" the defective memory cells from the Operating System (OS).

Although ECC memory and software algorithms, such as RMT, can be used to detect memory errors when they occur, they are not proactive methods for testing all system memory. Full memory testing is very time consuming and seldom finds failures, and thus is rarely performed ahead of a failure. In fact, most end users do not initiate full memory testing unless a system failure or a BSoD has occurred.

In the current state of the art, a full memory test can only be performed when the OS is not running. For example, a full memory test may be performed during the pre-boot phase (before the OS is loaded) by running the memory test from a BIOS extension or by booting the system from an external source, such as a Universal Serial Bus (USB) key. In the Windows Memory Diagnostic application provided in Windows 10, a full memory test may be performed after the operating system is loaded. However, the operating system must be halted while the memory test is executed. These methods, therefore, do not allow memory testing to be performed while the OS is running.

SUMMARY OF THE INVENTION

The following description of various embodiments of information handling systems and related methods is not to be construed in any way as limiting the subject matter of the appended claims.

According to various embodiments of the present disclosure, information handling systems (IHSs) and computer-implemented methods are provided herein for testing system memory (or another volatile memory component) of an IHS. The various embodiments of computer-implemented methods described herein may perform memory testing automatically: (a) during the pre-boot phase each time a new page of memory is allocated for the first time after a system boot, and (b) during OS runtime each time a read command is received and/or an event is detected. By proactively testing each page of memory, as the page is allocated but before information is stored therein, the computer-implemented methods described herein may prevent "bad" memory pages from being used.

Once a particular page of memory is tested, the computer-implemented methods described herein may prevent that page of memory from being tested again until the next system boot or until an event is detected during OS runtime. By testing any page only once per boot, the computer-implemented methods described herein significantly decrease test latency compared to conventional full memory test methods. Once an IHS has been booted for a while, the test latency provided by the computer-implemented methods described herein decreases to zero.

The computer-implemented methods described herein may utilize a variety of memory tests—ranging from low latency memory tests for detecting stuck bits to more aggressive memory tests—for testing memory as/before it is used. In some embodiments, the computer-implemented methods described herein may cycle through a list of memory tests by switching to the next memory test in the list at each subsequent system boot. This would allow very fast testing on a single boot, but very thorough testing over several boots.

In some embodiments, the computer-implemented methods described herein may perform additional memory testing in response to a detected event. Such embodiments may enable more aggressive memory tests to be used to detect/diagnose thermally induced memory failures and/or other memory failures, which may not be detected by conventional memory test methods.

Although various embodiments are described herein in the context of performing memory tests on a volatile memory component, such as system memory, the disclosed embodiments are not strictly limited to such and may alternatively include, or be performed on, substantially any suitable computer readable memory. As such, the present disclosure is considered to encompass all such embodiments.

According to one embodiment, a computer-implemented method is provided herein for testing a volatile memory component of an information handling system (IHS) during a pre-boot phase of the IHS. The computer-implemented method may be performed by at least one processing device of the IHS. The at least one processing device may be a host processor, an embedded controller (EC) or another processing device of the IHS. The at least one processing device may be generally configured to execute program instructions to perform the method steps of the computer-implemented method. Various method steps performed by the at least one processing device, via execution of the program instructions, are discussed in more detail below.

In some embodiments, the computer-implemented method may begin by creating a memory test bitmap (MTB) for all memory locations within the volatile memory component during the pre-boot phase before data or program code is stored within the volatile memory component. Each bit in the MTB may represent one page of memory within the volatile memory component. Once the MTB is created, the computer-implemented method may initialize all bits of the MTB to zero (0).

In some embodiments, the computer-implemented method may perform a memory test on at least one page of memory when the at least one page of memory is first allocated after the IHS is booted, and may set a bit in the MTB corresponding to the at least one page of memory to one (1) to indicate that the at least one page of memory has been tested. Each time one or more pages of memory of the volatile memory component are first allocated after the IHS is booted, the computer-implemented method may repeat the steps of: performing a memory test on the one or more pages of memory, and setting one or more bits in the MTB corresponding to the one or more pages of memory to one (1) to indicate that the one or more pages of memory have been tested.

In some embodiments, the computer-implemented method may perform one or more additional method steps prior to performing a memory test on at least one page of memory. For example, the computer-implemented method may determine if the bit in the MTB corresponding to the at least one page of memory is set to zero (0) or one (1) prior to performing the memory test, and may perform the memory test on the at least one page of memory only if the bit is set to zero (0).

Prior to performing a memory test on the at least one page of memory, some embodiments of the computer-implemented method may select from a plurality of memory tests, a particular memory test to be performed on the at least one page of memory. In some embodiments, selecting a particular memory test may include cycling through a list of memory tests by switching to a next memory test in the list at each subsequent boot.

In some embodiments, the computer-implemented method may perform one or more additional steps prior to a performing a memory test on the at least one page of memory. In one embodiment, for example, the computer-implemented method may create one or more variables specifying one or more memory test parameters, store the one or more variables within a non-volatile memory component of the IHS, and use at least one variable of the one or more variables to select a particular memory test from a plurality of memory tests prior to performing the particular memory test on the at least one page of memory.

In some embodiments, if the memory test detects a memory error within the at least one page of memory, the computer-implemented method may write details of the memory error to a data structure stored within the non-volatile memory component, and remove a region of memory in which the memory error was detected from a system memory map.

In some embodiments, the computer-implemented method may create an Advanced Configuration and Power Interface (ACPI) table, and may store a copy of the MTB within the ACPI table, so that the copy of the MTB may be accessed during OS runtime.

According to another embodiment, a computer-implemented method is provided herein for testing a volatile memory component of an information handling system (IHS) during an operating system (OS) runtime. The computer-implemented method may be performed by at least one processing device of the IHS. The at least one processing device may be a host processor, an embedded controller (EC) or another processing device of the IHS. The at least one processing device may be generally configured to execute program instructions to perform the method steps of the computer-implemented method. Various method steps performed by the at least one processing device, via execution of the program instructions, are discussed in more detail below.

In some embodiments, the computer-implemented method may begin upon receiving a read command during OS runtime for reading data from a computer readable storage device of the IHS into the volatile memory component. When a read command is received, the computer-implemented method may read a memory location parameter specified in the read command, wherein the memory location parameter corresponds to one or more pages of memory within the volatile memory component. Prior to writing the data into the one or more pages of memory, the computer-implemented method may access a memory test bitmap stored within a non-volatile memory component of the IHS to determine if the one or more pages of memory have already been tested. In some embodiments, each bit in the memory test bitmap may represent one page of memory within the volatile memory component.

In some embodiments, the memory test bitmap may be stored within an Advanced Configuration and Power Interface (ACPI) region of the non-volatile memory component of the IHS, so that the memory test bitmap may be accessed during OS runtime. In some embodiments, accessing the memory test bitmap to determine if the one or more pages of memory have already been tested may include: (a) determining that the one or more pages of memory have already been tested if all bits in the memory test bitmap corresponding to the one or more pages of memory is/are set to one (1), or (b) determining that at least one page of the one or more pages of memory has not yet been tested if at least one bit in the memory test bitmap corresponding to the at least one page of memory is set to zero (0).

If the memory test bitmap indicates that at least one page of the one or more pages of memory has not yet been tested, the computer-implemented method may perform a memory test on the at least one page of memory, and may set a bit in the memory test bitmap corresponding to the at least one page of memory to indicate that the at least one page of memory has been tested.

In some embodiments, the computer-implemented method may perform one or more additional method steps prior to performing a memory test on at least one page of memory. For example, the computer-implemented method may read at least one variable stored within the non-volatile memory component, wherein the at least one variable specifies one or more memory test parameters. In addition, the computer-implemented method may use the at least one variable to select a particular memory test from a plurality of memory tests prior to performing the particular memory test on the at least page of memory.

In some embodiments, if the memory test detects a memory error within the at least one page of memory, the computer-implemented method may write details of the memory error to a data structure stored within the non-volatile memory component, so that a region of memory in which the memory error was detected will be removed from a system memory map during a subsequent system boot.

In some embodiments, a default memory test may be initially performed on the at least one page of memory. In some embodiments, the computer-implemented method may detect an event during OS runtime. In some embodiments, the event may be a memory error detected during the default memory test, an elapsed period of time, a system failure, or a temperature measurement exceeding or falling below a threshold. If an event is detected, the computer-implemented method may reset all bits of the memory test bitmap to zero in response to the detected event, and select another memory test, which is more aggressive than the default memory test, to perform subsequent memory testing.

According another embodiment, an information handling system (IHS) provided herein includes at least one processing device, a volatile memory component comprising physical memory, and a non-volatile memory component comprising boot firmware. After the IHS is booted and before an operating system (OS) of the IHS is loaded, a boot service of the boot firmware may be executed by the at least one processing device to create a memory test bitmap (MTB) for all physical memory contained within the volatile memory component before the boot firmware is stored within the volatile memory component. In some embodiments, each bit in the MTB may represent one page of physical memory within the volatile memory component. Each bit in the MTB may be: set to zero (0) if a corresponding page of physical memory has not yet been tested, or set to one (1) if a corresponding page of physical memory has already been tested. After the MTB is created, the boot service may be executed by the at least one processing device to access the MTB each time a page of physical memory is allocated for the first time to determine if a bit corresponding to the page of physical memory has already been tested.

If the MTB indicates that the page of physical memory has not yet been tested, the boot service may be further executed by the at least one processing device to perform a memory test on the page of physical memory, and set a bit in the MTB corresponding to the page of physical memory to indicate that the page of physical memory has been tested. If the memory test detects a memory error within the page of physical memory, the boot service may be further executed by the at least one processing device to write details of the memory error to a data structure stored within the non-volatile memory component, and remove a region of memory in which the memory error was detected from a system memory map.

In some embodiments, the boot service may be executed by the at least one processing device to perform one or more additional steps or functions. In one example, the boot service may be executed to store a copy of the MTB within an Advanced Configuration and Power Interface (ACPI) table stored within an ACPI region of the non-volatile memory component. In another example, the boot service may be executed to store at least one variable specifying at least one memory test parameter within the non-volatile memory component. In yet another example, the boot service may be executed to create an ACPI Windows Management Instrumentation (WMI) method that enables details of any memory errors detected during OS runtime to be written to a data structure stored within the non-volatile memory component.

In some embodiments, the information handling system may also include a computer readable storage device comprising the operating system (OS) and an OS filter driver. During OS runtime, the OS filter driver may be executed by the at least one processing device to receive a read command for reading data from the computer readable storage device into the volatile memory component, and read a memory location parameter specified in the read command, wherein the memory location parameter corresponds to at least one page of physical memory within the volatile memory component. Prior to writing the data into the at least one page of physical memory, the OS filter driver may be further executed by the at least one processing device to access the copy of the MTB stored within the non-volatile memory component to determine if the at least one page of physical memory has already been tested.

If the copy of the MTB indicates that the at least one page of physical memory has not yet been tested, the OS filter driver may be further executed by the at least one processing device to perform a memory test on the at least one page of physical memory, and set a bit in the copy of the MTB corresponding to the at least one page of physical memory to indicate that the at least one page of physical memory has been tested. In some embodiments, prior to performing the memory test, the OS filter driver may be further executed by the at least one processing device to read the at least one variable stored within the non-volatile memory component to select a particular memory test from a plurality of memory tests, and perform the particular memory test specified in the at least one variable on the at least one page of physical memory.

If the memory test detects a memory error within the at least one page of physical memory, the OS filter driver may be further executed by the at least one processing device to call the ACPI WMI method to write details of the memory error to a data structure stored within the non-volatile memory component, so that a region of memory in which the memory error was detected will be removed from a system memory map during a subsequent system boot.

BRIEF DESCRIPTION OF THE DRAWINGS

Other advantages of the present disclosure will become apparent upon reading the following detailed description and upon reference to the accompanying drawings in which.

Figure 1:
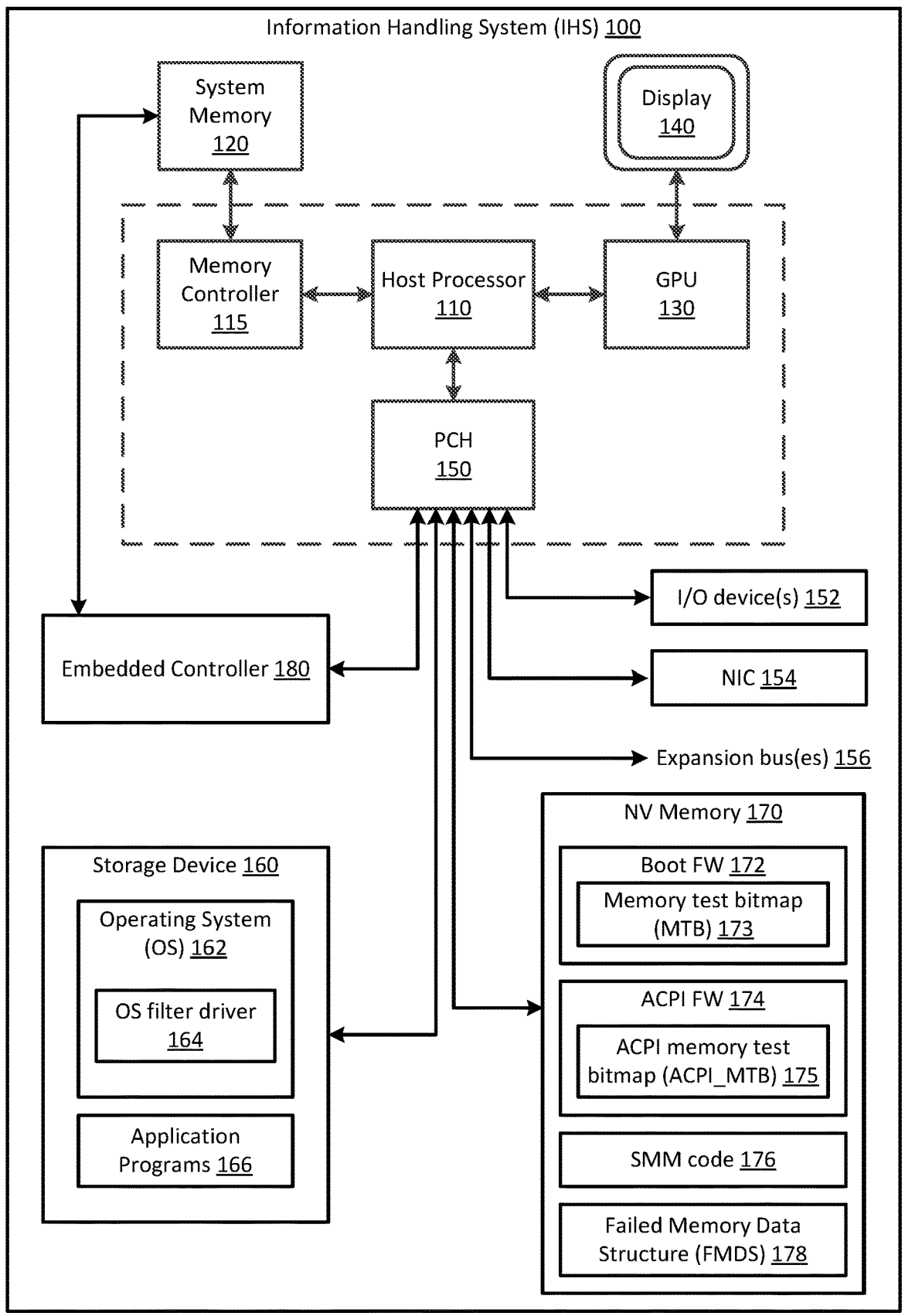
FIG. 1 is a block diagram illustrating one embodiment of an information handling system (IHS) in accordance with the present disclosure.

While the present disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the present disclosure is to cover all modifications, equivalents and alternatives falling within the spirit and scope of the present disclosure as defined by the appended claims.

DESCRIPTION OF ILLUSTRATIVE EMBODIMENTS

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may generally include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

FIG. 1 is a block diagram of an information handling system 100 (e.g., a desktop computer, laptop computer, tablet computer, server, etc.) as it may be configured according to one embodiment of the present disclosure. In the exemplary embodiment shown in FIG. 1, information handling system (IHS) 100 includes host processor 110, memory controller 115, system memory 120, graphics processor unit (GPU) 130, display device 140, platform controller hub (PCH) 150, Input/Output (I/O) devices 152, Network Interface Card (NIC) 154, expansion bus(es) 156, computer readable storage device 160, computer readable non-volatile (NV) memory 170, embedded controller (EC) 180 and temperature sensor 190. In the illustrated embodiment, host processor 110 is a silicon-on-chip (SoC) processing device having an integrated memory controller 115, GPU 130 and PCH 150. It is noted, however, that host processor 110 is not restricted to an SoC implementation. In other embodiments, host processor 110 may be coupled to memory controller 115, GPU 130 and PCH 150 via a northbridge controller (not shown).

It is expressly noted that the IHS configuration shown in FIG. 1 is exemplary only, and that the methods disclosed herein may be implemented on any type and/or configuration of information handling system having at least one processing device, system memory, computer readable NV memory containing boot firmware and Advanced Configuration and Power Interface (ACPI) firmware, and a computer readable storage device containing an operating system (OS) and OS driver. It will be further understood that while certain components of the information handling system are shown in FIG. 1 for illustrating embodiments of the present disclosure, the information handling system disclosed herein is not restricted to including only those components shown in FIG. 1 and described below.

Host processor 110 may include various types of programmable integrated circuits (e.g., a processor such as a controller, microcontroller, microprocessor, ASIC, etc.) and programmable logic devices (such as a field programmable gate array "FPGA", complex programmable logic device "CPLD", etc.). According to one embodiment, host processor 110 may include at least one central processing unit (CPU) having one or more processing cores. The CPU may include any type of processing device, such as an Intel Pentium series processor, an Advanced Micro Devices (AMD) processor or another processing device. In some embodiments, host processor 110 may include other types of processing devices including, but not limited to, a graphics-derivative processor (such as a physics/gaming processor), a digital signal processor (DSP), etc.

GPU 130 is coupled to host processor 110 and configured to coordinate communication between the host processor and one or more display components of the IHS. In the embodiment shown in FIG. 1, GPU 130 is coupled to display device 140 to provide visual images to the user. Display device 140 may be a display screen embedded within the chassis of the IHS, or an external display screen or monitor coupled to the IHS. In some embodiments, GPU 130 may be further coupled to one or more display ports to support additional display functions. Although GPU 130 is illustrated as being integrated with host processor 110 in an SoC implementation, GPU 130 may be alternatively implemented as a separate integrated circuit chip, which is coupled to host processor 110 via a bus, in other embodiments.

System memory 120 may be generally configured to store program instructions and/or data, which is accessible and executable by host processor 110. System memory 120 may otherwise be referred to as "main memory" or "physical memory." In some cases, the physical memory may be divided into fixed-length contiguous blocks of memory, called "pages." Before application program code can be executed by host processor 110, it is first loaded into one or more blocks or pages of physical memory. In some systems, a portion of the computer readable storage device 160 (e.g., a HDD or SSD) may be dedicated to storing data or application program code as "virtual memory." Similar to physical memory, virtual memory may also be divided into fixed-length contiguous blocks of memory, called "pages."

When virtual memory is utilized, data and/or application program code can be rapidly and repeatedly exchanged between virtual memory locations residing within computer readable storage device 160 and physical memory locations residing within system memory 120 via a process called "swapping." The use of virtual memory allows a portion of the application code being executed by the host processor 110 to be stored in physical memory, while remaining blocks (or pages) of data or application program code reside in virtual memory. When information is needed in physical memory, a memory management unit (MMU) translates virtual addresses into physical addresses, so that the requested virtual memory blocks or pages can be exchanged or swapped into physical memory.

System memory 120 may be implemented using any suitable memory technology, including but not limited to, random access memory (RAM), static RAM (SRAM), dynamic RAM (DRAM), synchronous dynamic RAM (SDRAM), non-volatile RAM (NVRAM), erasable programmable ROM (EPROM), electrically erasable programmable ROM (EEPROM), Flash memory, or any other type of volatile memory. In one embodiment, system memory 120 may include one or more dual in-line memory modules (DIMMs), each containing one or more RAM modules mounted onto an integrated circuit board. In some embodiments, each DIMM included within system memory 120 may include a serial presence detect (SPD) NVRAM containing memory configuration settings (e.g., memory timing, drive voltage, etc.) for configuring the memory controller, and one or more temperature sensors for detecting a temperature of the DIMMs.

In one exemplary embodiment, the DIMMs included within system memory 120 may be implemented as error correcting code (ECC) memory, and therefore, may have extra data bits that are used by memory controller 115 to detect and correct errors. When implemented as ECC DIMMs, memory controller 115 may be configured to detect and correct single-bit errors (i.e., an ECC correctable error), and detect but not correct errors of 2 bits per 64-bit word (i.e., an ECC uncorrectable error). It is recognized, however, that system memory 120 is not limited to DIMMs or ECC DIMMs and may be implemented with other types of volatile memory, in other embodiments.

Memory controller 115 is coupled between host processor 110 and system memory 120 and configured to manage the flow of data there between. Although memory controller 115 is illustrated as being integrated with host processor 110 in an SoC implementation, memory controller 115 may be alternatively implemented as a separate integrated circuit chip, in other embodiments. For example, memory controller 115 may be provided within a memory controller hub, which is coupled between host processor 110 and system memory 120.

In some embodiments, memory controller 115 may be configured to manage the flow of data between host processor 110 and system memory 120 according to the memory configuration settings (e.g., memory timing, driving voltage, etc.) stored within the SPD NVRAM. For example, memory controller 115 may conduct read operations from, and write operations to, system memory 120 on behalf of host processor 110 using the stored memory configuration settings. When a read or write command is received from host processor 110, memory controller 115 translates the physical address of the physical memory location specified in the read/write command to row and column data addresses within system memory 120.

In one embodiment, memory controller 115 may check the integrity of data read from system memory 120 during each read operation performed by host processor 110 (or another IHS component). In some embodiments, for example, memory controller 115 may perform an error correction code (ECC) check on the data read from system memory 120 during each read operation to detect soft errors, including single bit and multi-bit memory errors. In other embodiments, memory controller 115 may not perform ECC checks when data is read from system memory 120.

PCH 150 is coupled to host processor 110 and configured to handle input/output (I/O) operations for the IHS. In some embodiments, PCH 150 may be connected to host processor 110 via a direct media interface (DMI), and may include a plurality of different communication interfaces and ports for communicating with various system components, such as I/O devices 152, NIC 154, expansion bus(es) 156, computer readable storage device 160, computer readable non-volatile (NV) memory 170, and embedded controller (EC) 180, in addition to other IHS component(s) not explicitly shown and described herein.

Examples of communication interfaces and ports that may be included within PCH 150 include, but are not limited to, a Peripheral Component Interconnect (PCI) interface, a PCI-Express (PCIe) interface, a Serial Peripheral Interface (SPI), an Enhanced SPI (eSPI), a Serial AT Attachment (SATA) interface, a Low Pin Count (LPC) interface, a Small Computer Serial Interface (SCSI), an Industry Standard Architecture (ISA) interface, an Inter-Integrated Circuit ($I^2C$) interface, a Universal Serial Bus (USB) interface and a Thunderbolt™ interface. Examples of expansion bus(es)

156 that may be coupled to PCH 150 include, but are not limited to, a PCI bus, a PCIe bus, a SATA bus, a USB bus, etc.

Computer readable storage device 160 may include any type of persistent, non-transitory computer readable storage device, such as one or more hard disk drives (HDDs) or solid-state drives (SSDs), and may be generally configured to store software and/or data. In some embodiments, computer readable storage device 160 may be configured to store an operating system (OS) 162 and an OS filter driver 164, in addition to one or more application programs 166 and data. OS 162 may generally contain program instructions (or computer program code), which may be executed by host processor 110 during OS runtime to perform various tasks and functions for the information handling system and/or for the user.

As noted above, a portion of the computer readable storage device 160 may be dedicated to storing data or application program code in virtual memory. When a read command is received during OS runtime for reading data from virtual memory into physical memory, OS filter driver 164 may be executed by host processor 110 to test the physical memory location specified within the read command before the data is written into the physical memory location. Additional functions of the OS filter driver 164 are discussed in more detail below.

Computer readable NV memory 170 may include any type of non-volatile memory including, but not limited to, read-only memory (ROM), non-volatile random access memory (NVRAM) and Flash memory, and may be generally configured to store software and/or firmware modules. The software and/or firmware modules stored within computer readable NV memory 170 may generally contain program instructions (or computer program code), which may be executed by host processor 110 to instruct components of IHS 100 to perform various tasks and functions for the information handling system.

As shown in FIG. 1, computer readable NV memory 170 may generally include boot firmware (FW) 172, Advanced Configuration and Power Interface (ACPI) firmware 174 and System Management Mode (SMM) code 176, in addition to other software/firmware modules and/or data structures. Failed memory data structure (FMDS) 178 is one example of a data structure that may be stored within computer readable NV memory 170. As described in more detail below, FMDS 178 may contain details of memory errors, which may be detected within the system memory 120 during boot and/or during OS runtime.

Boot firmware 172 includes software and/or firmware modules for specifying hardware configuration settings, system date/time and boot sequence, etc. In some embodiments, boot firmware 172 may be implemented as a Basic Input/Output System (BIOS) and/or a Unified Extensible Firmware Interface (UEFI). When IHS 100 is initially powered on or rebooted, program instructions within boot firmware 172 may be executed by host processor 110 to configure hardware components of the IHS, perform a Power-On Self-Test (POST) to ensure the hardware configuration is valid and working properly, discover and initialize devices and launch a bootloader to load OS 162. Once launched, the bootloader within boot firmware 172 retrieves OS 162 from computer readable storage device 160 and loads it into system memory 120.

As known in the art, boot firmware 172 may generally include boot services and runtime services. Boot services are available for execution when boot firmware 172 owns the system platform during a pre-boot phase of the boot firmware before OS 162 is loaded and running. Runtime services, on the other hand, are available for execution while the OS is running (i.e., during OS runtime). Examples of boot services typically provided within boot firmware 172 include, but are not limited to, text and graphical consoles, bus, block and file services, and initializing memory components. Examples of runtime services typically provided within boot firmware 142 include, but are not limited to, date/time configuration settings and access to memory components. In addition to those typically provided, boot firmware 172 may include additional boot and/or runtime services, which may be executed by host processor 110 (or another processing device) to perform various steps of the methods disclosed herein.

Each time IHS 100 is booted or restarted, a boot service of boot firmware 172 may be executed by host processor 110 (or another processing device) to: (a) create a memory test bitmap (MTB) 173 for all physical memory locations within system memory 120 before data or program code is stored within the system memory, and (b) perform a memory test on at least one page of physical memory when the at least one page of physical memory is first allocated after the IHS is booted. In some embodiments, the memory test bitmap (MTB) 173 created by the boot service may be a data structure, which contains one bit for each page of physical memory. Each bit within the MTB 173 may be set to indicate whether or not a corresponding page of physical memory has been tested since the lase IHS boot. In some embodiments, for example, each bit within the MTB 173 may be set to: (a) '0' to indicate that the corresponding page of physical memory has not yet been tested, or (b) '1' to indicate that the corresponding page of physical memory has already been tested. Once created by the boot service, the MTB 173 may be stored within a volatile memory component (e.g., system memory 120) or a non-volatile memory component (e.g., NV memory 170) of the IHS 100.

When IHS 100 is initially booted or restarted, MTB 173 is created by the boot service and initialized to all zeros ('0') to indicate that the physical memory within system memory 120 has not yet been tested. Whenever boot firmware 172 allocates a new page of physical memory, the boot service checks MTB 173 to determine if the bit corresponding to that page is set to '0' or '1' prior to performing a memory test. If the corresponding bit is set to '1', the boot service may store data or program code, or may allow data or program code to be stored, within that page of physical memory.

If the corresponding bit is set to '0', the boot service performs a memory test on that page and sets the corresponding bit in MTB 173 to '1'. The boot service may utilize a variety of memory tests commonly used to test memory. If at least one memory error is detected on the page, the boot service may write details of the memory error(s) to the failed memory data structure (FMDS) 178 stored within NV memory 170. Any pages(s) that fail a memory test are reserved (e.g., removed from the system memory map) during the pre-boot phase to ensure that those page(s) will not be used.

ACPI firmware 174 serves as an interface layer between boot firmware 172 and OS 162, and provides OS-independent interfaces between the platform hardware and OS-specific technologies, interfaces and code. As known in the art, ACPI firmware 174 includes ACPI tables, ACPI BIOS and ACPI registers. During the pre-boot phase of boot firmware 172, ACPI firmware 174 communicates available hardware components and their functions to OS 162 using methods provided by boot firmware 172, constructs all ACPI tables, and populates the interfaces and handlers to be used during OS runtime. ACPI tables are commonly used during OS runtime to provide ACPI runtime services to OS 162.

In some embodiments, boot firmware 172 may publish an address of MTB 173 within an ACPI table, so that MTB 173 may be accessed by the operating system during OS runtime. In other embodiments, a copy of the MTB 173 (i.e., ACPI_MTB 175) may be included within an ACPI table stored within an ACPI region of NV memory 170. Providing access to MTB 173 (or providing ACPI_MTB 175) within an ACPI table enables the operating system to access the MTB 173 (or the ACPI_MTB 175) during OS runtime using ACPI handlers and control methods. In some embodiments, OS filter driver 164 may access MTB 173 (or ACPI_MTB 175) during OS runtime to determine if a particular page of physical memory has been tested. If the particular page has not yet been tested, the OS filter driver 164 may perform a memory test on that page before allowing data or program code to be stored within that page.

In some embodiments, boot firmware 172 may create one or more variables during the pre-boot phase that specify memory test parameters to be used when testing memory during the pre-boot phase and during OS runtime. For example, a first variable may be used to select a memory test to be used for testing, while a second variable is used to specify when to perform more aggressive memory testing (e.g., if memory error(s) are detected during a default memory test or in response to an event). The one or more variables created by boot firmware 172 may be stored within a non-volatile memory component (e.g., NV memory 170) of the IHS 100 as BIOS/UEFI variables, ACPI variables or variables used in an SMI function. During OS runtime, OS filter driver 164 may read the one or more variables stored within NV memory 170 to determine the memory test parameters to use when performing a memory test on one or more pages of physical memory.

In some embodiments, boot firmware 172 may create an ACPI control method during the pre-boot phase that enables OS filter driver 164 to write details of any memory errors detected during OS runtime to the failed memory data structure (FMDS) 178 stored within NV memory 170. In one embodiment, the ACPI control method created by boot firmware 172 may be an ACPI Windows Management Instrumentation (WMI) method, which may be stored within an ACPI region of NV memory 170. During OS runtime, OS filter driver 164 may call the ACPI WMI method to write details of the memory error(s) to the failed memory data structure (FMDS) 178 stored within NV memory 170.

During OS runtime, OS filter driver 164 may be executed by host processor 110 (or another processing device) to test one or more pages of physical memory before data or program code is written into the one or more pages of physical memory. In some embodiments, OS filter driver 164 may initiate memory testing whenever data or program code is read from computer readable storage device 160 into system memory 120 during OS runtime. For example, OS filter driver 164 may initiate memory testing when an application program is being loaded from computer readable storage device 160 into system memory 120, or when virtual memory from the computer readable storage device 160 is swapped into the system memory 120.

In one example embodiment, OS filter driver 164 may initiate memory testing whenever a read command is received for reading one or more HDD sectors into physical memory. Before the information contained within the HDD sector(s) is read into one or more pages of physical memory, OS filter driver 164 may access ACPI_MTB 175 to determine if the one or more pages of physical memory have been tested. If the corresponding bit(s) in ACPI_MTB 175 are set to '1,' indicating that the one or more pages have already been tested, OS filter driver 164 may store or allow the information contained within the HDD sector(s) to be stored within the one or more pages of physical memory.

If the corresponding bit(s) in ACPI_MTB 175 are set to '0', however, OS filter driver 164 performs a memory test on the page(s) and sets the corresponding bit(s) in the ACPI_MTB 175 to '1'. The OS filter driver 164 may use a variety of memory tests commonly used to test memory. If no memory errors are detected on the page(s), OS filter driver 164 may store or allow the information contained within the HDD sector(s) to be stored within the one or more pages of physical memory. However, if at least one memory error is detected on the page(s), OS filter driver 164 may call an ACPI WMI method to write details of the memory error(s) to the failed memory data structure (FMDS) 178 stored within NV memory 170. On the next system boot, boot firmware 172 may reserve any pages(s) of physical memory that failed a memory test during OS runtime, and may set the corresponding bit(s) in the MTB 173 to '1', so that those page(s) will not be used or retested.

As noted above, the boot service within boot firmware 172 and the OS filter driver 164 may each utilize a variety of memory tests when testing physical memory locations within system memory 120 during the pre-boot phase and during OS runtime. Any memory test commonly used to test memory may be used by the boot service and OS filter driver 164. In some embodiments, a low latency memory test may be used to test the physical memory contained within system memory 120. Examples of low latency memory tests include, but are not limited to, filling a page with all '0FFh' or all '00h' and confirming that the page contains all '0FFh' or all '00h' when subsequently read.

In some embodiments, a default memory test (such as a low latency memory test) may be initially performed by the boot service during the pre-boot phase and/or by the OS filter driver 164 during OS runtime. However, a more aggressive memory test may also be performed, in some embodiments. For example, a more aggressive memory test may be performed: (a) periodically (e.g., every 8 hours, once a day, once a week, etc.), (b) in response to an event (such as, e.g., a system failure or a temperature measurement exceeding/falling below a threshold), or (c) if memory error(s) are detected during the default memory test. Performing a more aggressive memory test may enable the boot service or the OS filter driver 164 to detect stuck bits and other types of memory errors.

Examples of more aggressive memory tests include a walking '1' test or a walking '0' test, in which a series of '1's or '0's are written to each memory cell location and read from the memory cell location to confirm that the bit written into the memory cell location is the same as the bit read from the memory cell location. The walking '1' and walking '0' tests are two examples of more aggressive memory tests that may be used to check for stuck bits. Another example of a more aggressive memory test includes reading a HDD sector or an image into one or more pages of physical memory, calculating a checksum (or CRC) of the pages, exclusive OR-ing all bytes in the pages, and then exclusive OR-ing all bytes in the pages again before confirming that the checksum (or CRC) is still correct. In some cases, a memory test may be performed with the cache disabled for the tested pages.

In some embodiments, the boot service and/or the OS filter driver 164 may cycle through a list of memory tests by switching to the next memory test in the list at each subsequent system boot. This would allow very fast testing on a single boot, but very thorough testing over several boots.

In some embodiments, a boot firmware setup option may be used to select which memory test(s) to be performed during the pre-boot phase and/or during OS runtime. In other embodiments, a particular memory test may be selected via a registry key, a configuration file or a variable stored within a non-volatile memory component of the IHS 100, such as NV memory 170. For example, a variable may be created during the pre-boot phase, stored within the non-volatile memory component and used during the pre-boot phase and/or during OS runtime to select a memory test to be used for testing. Other variable(s) may be created, stored within the non-volatile memory component and used to specify other memory test parameters, such as when to perform more aggressive memory testing.

As noted above, memory testing is performed during the pre-boot phase and during OS runtime each time physical memory is used for the first time after a system boot. This enables memory that is used most often to be tested first, while memory that is seldom used is tested less often. By testing physical memory before data or program code is stored therein, the boot service and OS filter driver 164 described herein prevent "bad" memory blocks or pages from being written to. Once a particular block or page of physical memory is tested by the boot service or the OS filter driver 164, a corresponding bit is set to '1' within the MTB 173 or the ACPI_MTB 175. In some embodiments, setting the corresponding bit to '1' prevents that block or page of physical memory from being tested again until the next system boot. By only testing any page once per boot, testing latency decreases to zero after the system has been booted for a while.

In some embodiments, additional memory testing may be performed or triggered in response to a detected event. Examples of events that may trigger additional memory testing include, but are not limited to, a memory error detected during a default memory test, an elapsed period of time, a system failure or a temperature measurement exceeding or falling below a threshold value. Other events not specifically mentioned herein may also trigger additional memory testing.

In some embodiments, host processor 110 may enter a system management mode (SMM) when an event is detected during OS runtime. As known in the art, SMM is a special-purpose operating mode provided for handling system events (like memory or chipset errors), managing system safety (such as, e.g., turning system fans on/off and shutting down the system when high CPU temperatures are detected), and performing other power management and control operations. The SMM can only be entered via a system management interrupt (SMI), which may be triggered by a hardware interrupt (e.g., via assertion of an interrupt pin of the host processor chip), or by a software interrupt via execution of an instruction (e.g., an instruction that writes an I/O port or address range that is recognized by the system as making a request to trigger an SMI). Once the SMM mode is entered, host processor 110 may execute the SMM code in a separate address space, which is inaccessible to other operating modes of the host processor.

As shown in FIG. 1, SMM code 176 may be stored within NV memory 170 and may generally include SMI functions and SMI handlers. Upon system startup, the SMI functions stored within SMM code 176 may be loaded into an SMM code region of system memory 120 during the boot process. Before loading SMM code 174 into the SMM code region, the boot service described above may perform a memory test on the SMM code region and set corresponding bits in the MTB 173 to '1.' If any memory errors are detected within the SMM code region, the boot service may provide details of the memory error(s) to the failed memory data structure (FMDS) 178 and remove the "bad" memory blocks or pages from the system memory map. If an SMI is generated during OS runtime, an SMI handler may be invoked in response to the SMI to fetch an SMI function corresponding to the SMI from system memory 120. Once loaded into system memory, the SMI function may be executed by host processor 110 to handle the SMI.

In some embodiments, an SMI may be generated in response to a detected event, such as a memory error detected during a default memory test, an elapsed period of time, a system failure or a temperature measurement exceeding or falling below a threshold value. Once an SMI is generated, an SMI handler may be invoked to load a corresponding SMI function stored within the SMM code region of system memory 120 into host processor 110. In some embodiments, the SMI function may be executed by host processor 110 to erase ACPI_MTB 175 and restart memory testing in response to the detected event. In some embodiments, a more aggressive memory test may be performed in response to the detected event.

Embedded controller (EC) 180 is coupled to PCH 150 and configured to execute program instructions to boot information handling system 100, load firmware from NV memory 170 into system memory 120, and launch the firmware, etc. EC 180 may also perform other functions, such as power/thermal system management. EC 180 may include a processing device for executing program instructions to perform the above stated functions. Although not strictly limited to such, the processing device of EC 180 may be implemented as a programmable integrated circuit (e.g., a controller, microcontroller, microprocessor, ASIC, etc.) or as a programmable logic device "PLD" (such as field programmable gate array "FPGA", complex programmable logic device "CPLD", etc.).

In some embodiments, EC 180 may be coupled to system memory 120, as shown in FIG. 1. In such embodiments, EC 180 may be configured to read a temperature of system memory 120 via the temperature sensor(s) provided on the system memory (e.g., thermistor placed on or near memory components of system memory 120), and may be configured to generate an SMI when the temperature exceeds or falls below a threshold value. In some embodiments, EC 180 may comprises a real-time clock, and may be configured to generate an SMI periodically after an elapsed period of time.

As noted above, some information handling systems may include a software algorithm that functions to detect memory failures and permanently map out failed areas of a memory component that are determined to be "bad" by writing the bad memory ranges to another IHS memory component (such as, e.g., an SPD NVRAM of system memory 120). One example of such an algorithm is the Reliable Memory Technology (RMT) algorithm, which is provided on many Dell information handling systems and used to detect memory failures, including thermally induced memory failures and other, more permanent types of memory failures.

The RMT algorithm is typically executed when uncorrectable memory errors are encountered, or when a pre-defined number of correctable memory errors is encountered. Although the RMT is executed when memory errors are detected, it is not a proactive method for testing all system memory. The RMT algorithm also fails to differentiate thermally induced memory failures from other types of memory failures, and therefore, cannot determine if a memory failure is temporary (e.g., thermally induced) or permanent. If a thermally induced memory failure occurs on an RMT enabled system, an otherwise "good" memory component may have regions that are permanently disabled by the RMT algorithm.

Conventional solutions for performing a full memory test include running a full memory test from a BIOS extension, booting the system with a USB key, or running the Windows Memory Diagnostic application provided, for example, in Windows 10. These conventional solutions are very time consuming and seldom finds failures, and thus, are rarely performed ahead of a failure (e.g., a BSoD or other system failure). In addition, the conventional memory testing solutions mentioned above all require a system reboot, and thus, cannot be performed while the operating system is running.

To overcome the disadvantages mentioned above, the present disclosure provides an improved system and methods for testing all system memory. Unlike conventional solutions for performing full memory testing, the methods disclosed herein are performed automatically by hardware and software components of the information handling system, and thus, require no interaction on the end user's part (i.e., do not require the end user to perform memory testing manually by running a BIOS extension, booting from a USB key, or running a Windows Memory Diagnostic application). In the disclosed methods, a variety of memory tests—ranging from low latency memory tests to more aggressive memory tests—can be utilized for testing memory as/before it is used. By testing memory as/before it is used, the methods disclosed herein prevent "bad" memory blocks or pages from being written to.

In some embodiments, event-driven memory testing can be performed automatically in response to a detected event, such as a memory error detected during a default memory test, an elapsed period of time, a system failure or a temperature measurement exceeding or falling below a threshold value. By performing event-driven memory testing, the methods disclosed herein may be used to detect difficult to diagnose or "cannot duplicate" memory failures, such as thermally induced failures.

In addition to the advantages mentioned above, the methods disclosed herein are performed dynamically (i.e., in real-time) in response to any type of memory failure before the RMT algorithm is executed by the host processor. This prevents the RMT algorithm from permanently disabling "failed" memory blocks when a thermally induced memory failure is detected.

Figure 2:
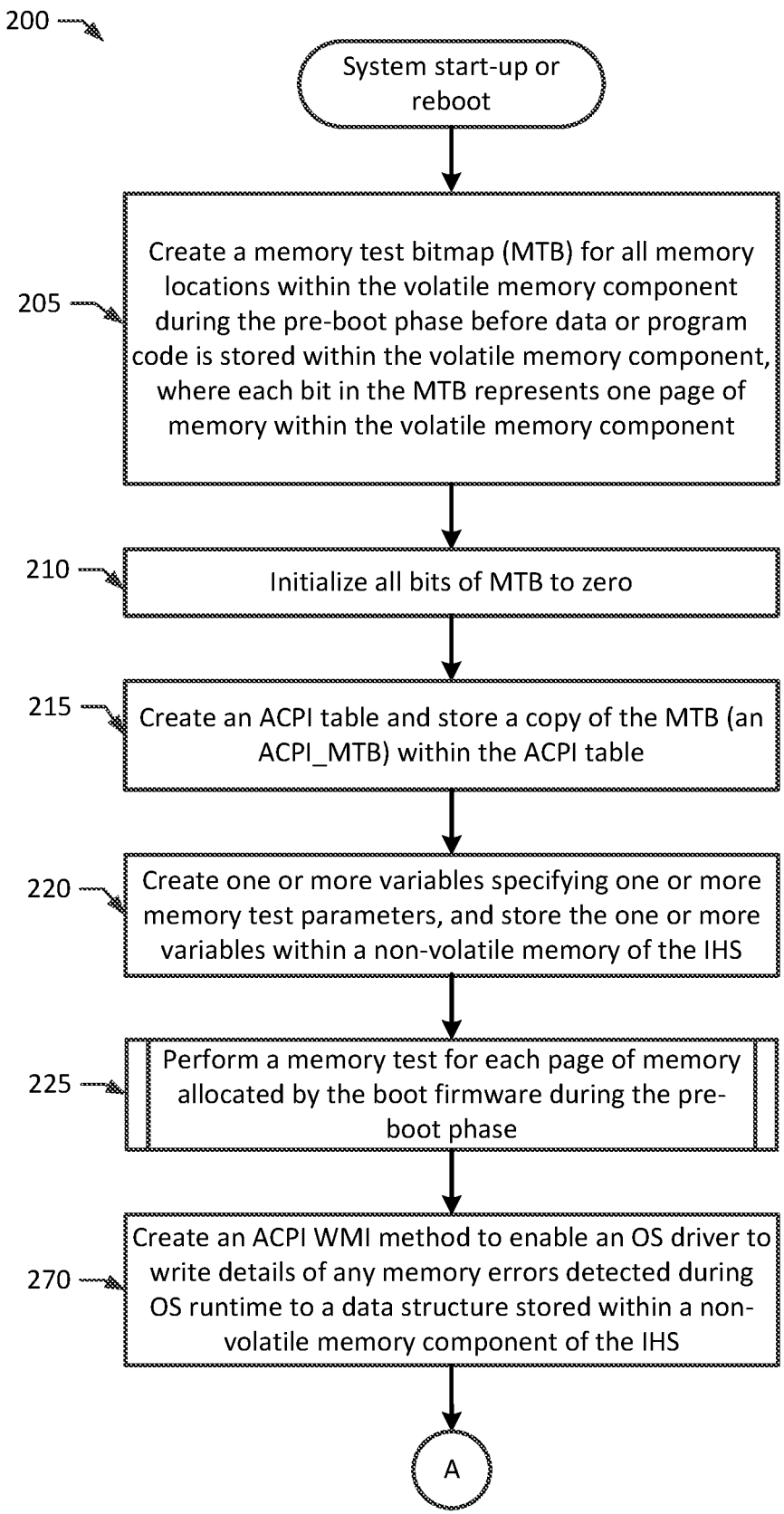
FIG. 2 is a flowchart diagram illustrating one embodiment of a method for testing a volatile memory component of an IHS, wherein the method is a computer-implemented method performed by boot firmware during a pre-boot phase of the IHS.
Figure 2:
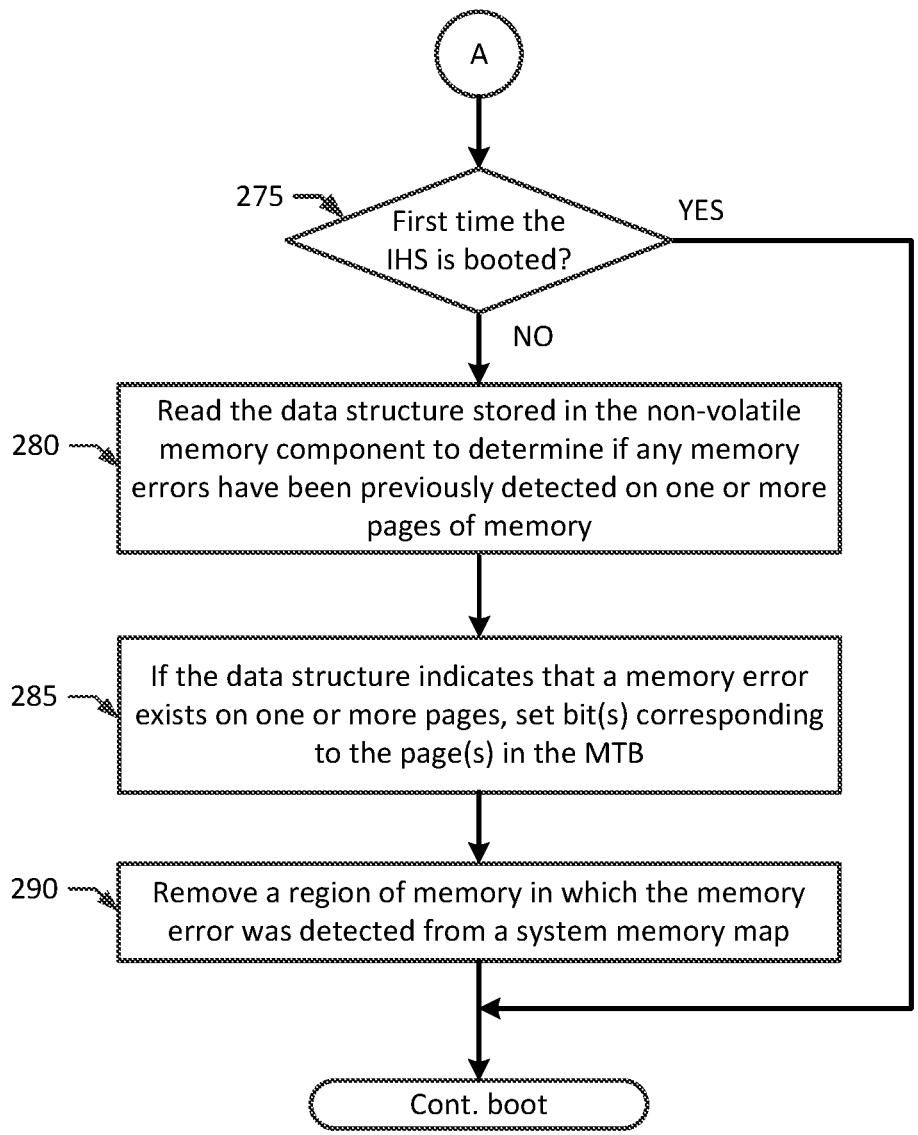
Figure 3:
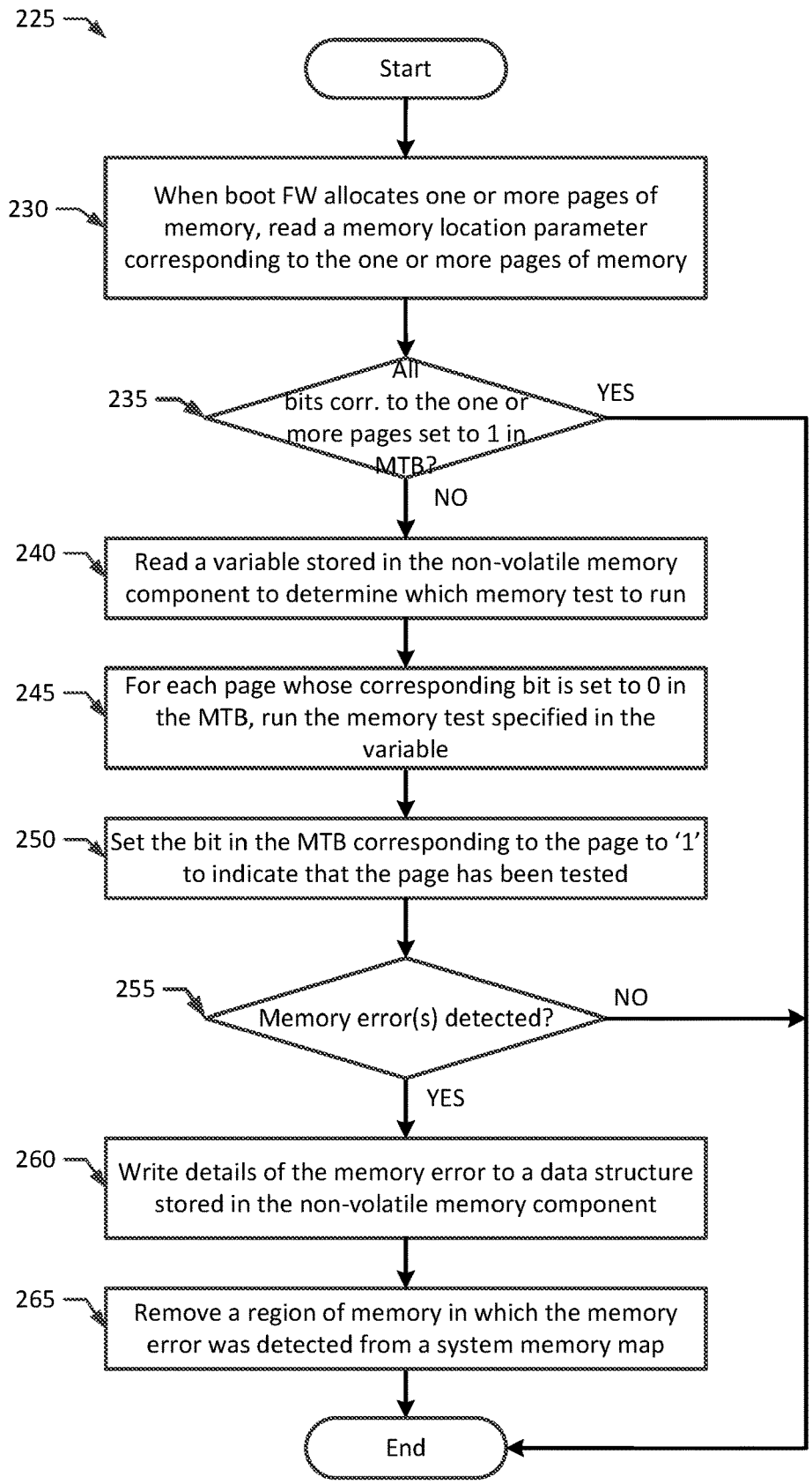
FIG. 3 is a flowchart diagram illustrating one embodiment of a method to perform a memory test for each page of physical memory allocated by the boot firmware.
Figure 4:
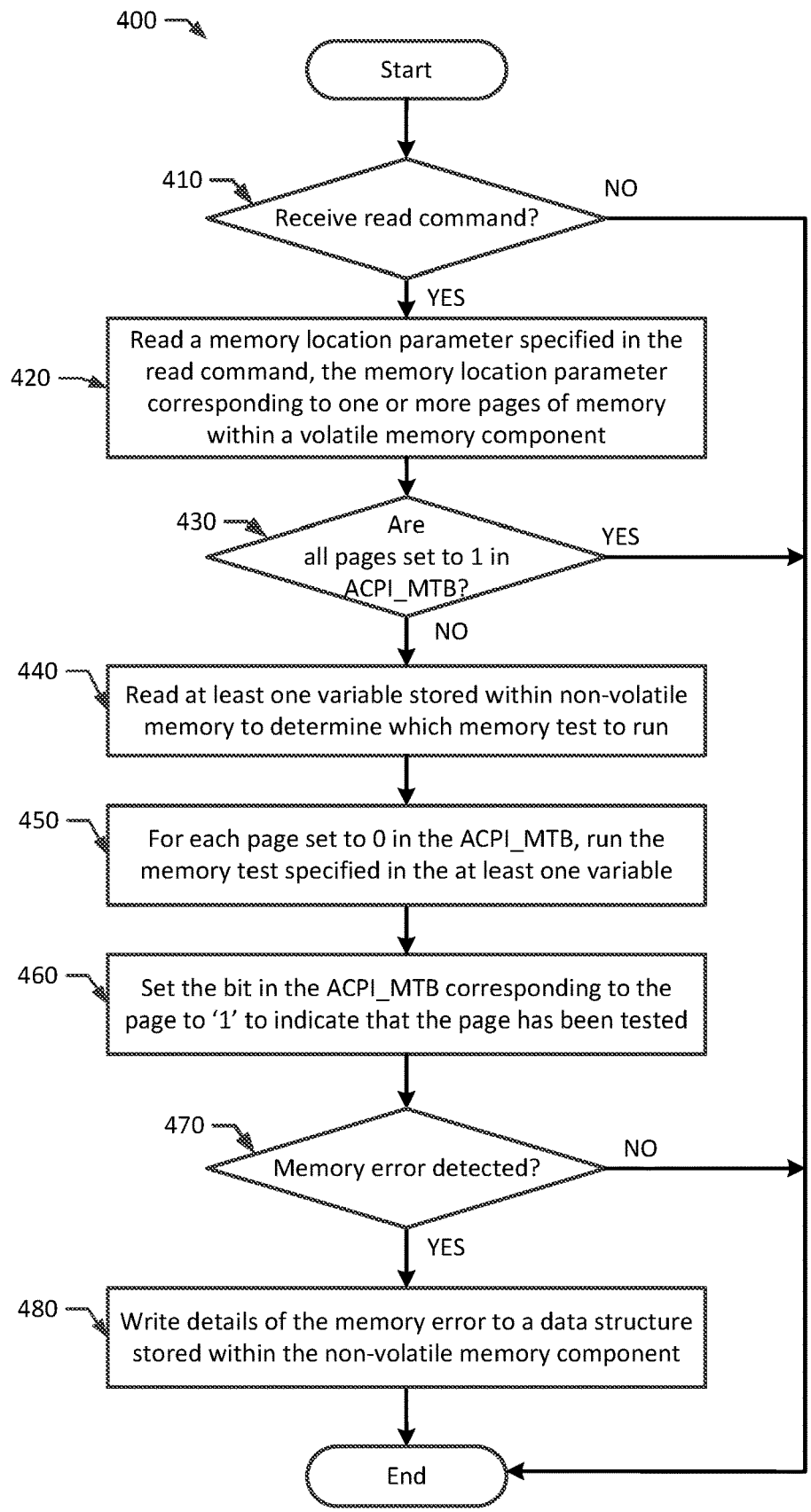
FIG. 4 is a flowchart diagram illustrating another embodiment of a method for testing a volatile memory component of an IHS, wherein the method is a computer-implemented method performed by an operating system (OS) driver during OS runtime.
Figure 5:
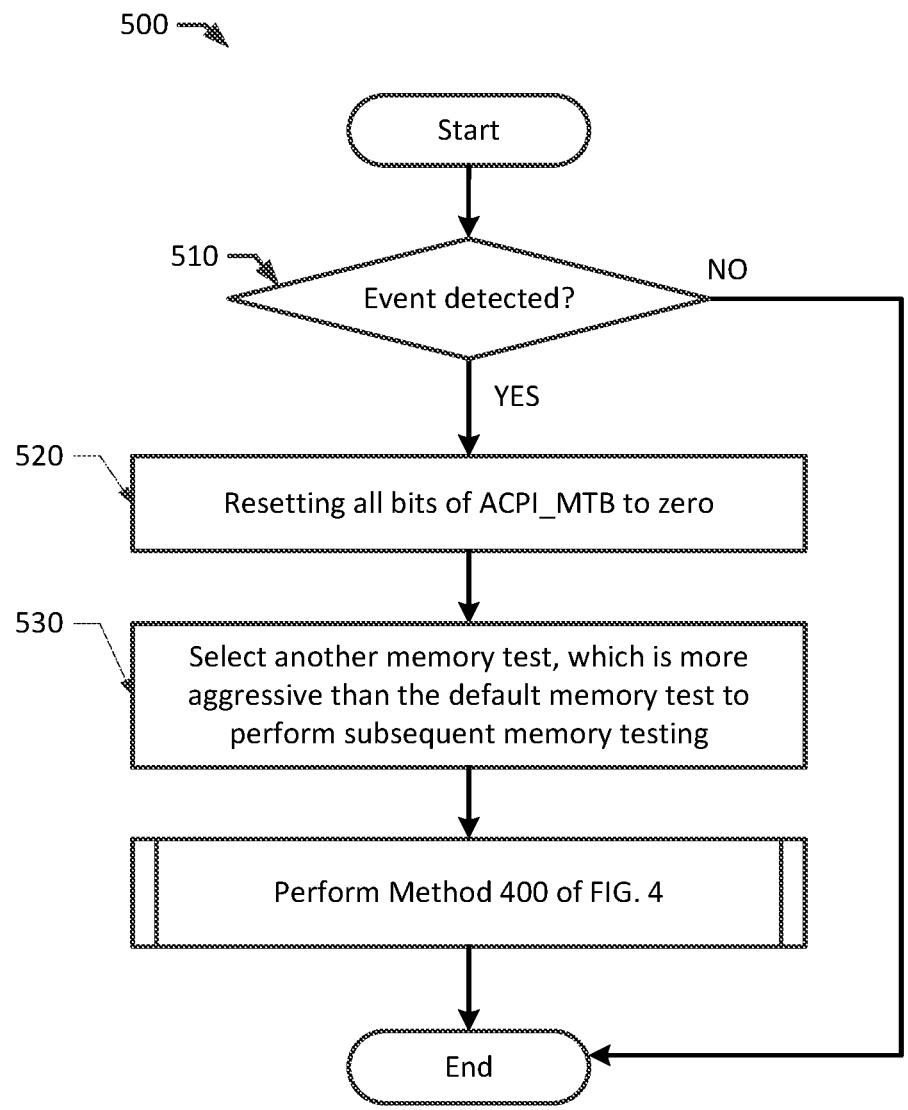
FIG. 5 is a flowchart diagram illustrating yet another embodiment of a method for testing a volatile memory component of an IHS, wherein the method is a computer-implemented method performed by an operating system (OS) driver during OS runtime.

FIGS. 2-5 illustrate various embodiments of memory testing methods in accordance with the present disclosure. The methods shown in FIGS. 2-5 may generally be implemented by at least one processing device of an information handling system (IHS) executing program instructions during an IHS boot process and during OS runtime. For example, FIGS. 2-3 illustrate one embodiment of a method that may be used for testing a volatile memory component of an IHS during a pre-boot phase of the IHS. FIGS. 4 and 5, on the other hand, illustrate embodiments of a method that may be used for testing a volatile memory component of an IHS during OS runtime. System memory 120 of IHS 100 is one example of a volatile memory component for which the methods shown in FIGS. 2-5 may be used.

The methods shown in FIGS. 2-5 are computer implemented methods performed by hardware, software and/or firmware components of the information handling system (e.g., IHS 100). In some embodiments, at least one processing device of the IHS (e.g., host processor 110, EC 180 and/or another processing device) may execute program instructions to implement the computer implemented methods shown in FIGS. 2-5. In one example embodiment, host processor 110 may execute boot services of boot firmware 172 to perform the method steps shown in FIGS. 2 and 3, and may execute OS filter driver 164, ACPI firmware 174 and/or SMM program code 176 to perform the method steps shown in FIGS. 4 and 5. It is noted, however, that the computer implemented methods shown in FIGS. 2-5 are not strictly limited to such an embodiment, and can be implemented by another IHS processing device (e.g., an embedded controller, microcontroller, or another processing device) executing other program instructions, in other embodiments.

The computer implemented methods shown in FIGS. 2-5 improve how an information handling system functions, in at least some respects, by automatically performing memory testing: (a) during the pre-boot phase each time a new page of memory is allocated for the first time after a system boot, and (b) during OS runtime each time a read command is received and/or an event is detected. By proactively testing each page of memory, as the page is allocated but before information is stored therein, the computer implemented methods described herein prevent "bad" memory pages from being used.

Once a particular page of memory is tested, the computer implemented methods described herein prevent that page of memory from being tested again until the next system boot or until an event is detected. By testing any page only once per boot, the computer-implemented methods described herein significantly decrease test latency compared to conventional full memory test methods. Once the system has been booted for a while, the test latency provided by the computer-implemented methods described herein decreases to zero. In some embodiments, the computer implemented methods described herein may cycle through a list of memory tests by switching to the next memory test in the list at each subsequent system boot. This would allow very fast testing on a single boot, but very thorough testing over several boots.

In addition to performing memory testing in response to memory allocation, some embodiments of the computer implemented methods described herein may perform additional memory testing in response to a detected event. Such embodiments may enable more aggressive memory tests to be used to detect/diagnose thermally induced memory failures and/or other types of memory failures, which may not be detected by conventional memory test methods.

FIGS. 2-3 illustrate one embodiment of a method 200 that may be used for testing a volatile memory component (e.g., system memory 120 or another volatile memory component) of an information handling system (IHS) during a pre-boot phase of the IHS. It will be recognized that the embodiment shown in FIGS. 2-3 is merely one example of a method that may be used for testing a volatile memory component during an IHS boot process. In some embodiments, additional steps may be added to, or removed from, the method shown in FIGS. 2-3 as the steps shown and described herein are not intended to be exclusive. Moreover, the order of the steps is not limited to the order shown in FIGS. 2-3, as different orders may occur and/or various steps may be performed in combination or at the same time.

According to one embodiment, method 200 may begin by creating a memory test bitmap (MTB) for all memory locations within the volatile memory component during the pre-boot phase before data or program code is stored within the volatile memory component (in step 205). In some embodiments, the MTB may be created before boot firmware code is loaded into the volatile memory component. As noted above, each bit in the MTB may represent one page of memory within the volatile memory component. Once the MTB is created, method 200 may initialize all bits of the MTB to zero (in step 210).

In step 215, method 200 creates an ACPI table and stores a copy of the MTB (e.g., ACPI_MTB 175) within the ACPI table. In step 220, method 200 creates one or more variables specifying one or more memory test parameters, and stores the one or more variables within a non-volatile memory component of the IHS. In step 225, method 200 performs a memory test for each page of memory, which is allocated by the boot firmware during the pre-boot phase. FIG. 3 illustrates one embodiment of a memory test method that may be used in step 225 of FIG. 2.

When boot firmware allocates one or more pages of memory, method 200 may read a memory location parameter corresponding to the one or more pages of memory (in step 230) and may determine (in step 235) if all bits corresponding to the one or more pages are set to '1' in the MTB. If all bits are set to '1' (YES branch of step 235), no memory testing is performed in step 225 and the method may return to step 270 of FIG. 2. In some embodiments, method 200 may store data or program code, or may allow data or program code to be stored, within the one or more pages if all bits corresponding to the one or more pages are set to '1' in the MTB.

If at least one bit is set to '0' (NO branch of step 235), however, method 200 may read a variable stored within the non-volatile memory component to determine which memory test to run. For each page whose corresponding bit in the MTB is set to '0', method 200 runs the memory test specified in the variable (in step 245) and sets the bit in the MTB corresponding to the page to '1' to indicate that the page has been tested (in step 250). If no memory errors are detected by the memory test (NO branch of step 255), the method shown in FIG. 3 may end and return to step 270 of FIG. 2. In some embodiments, method 200 may store data or program code, or may allow data or program code to be stored, within the pages that pass the memory test.

If the memory test detects a memory error on at least one page of memory (YES branch of step 255), method 200 may write details of the memory error to a data structure stored within the non-volatile memory component of the IHS (in step 260), and may remove a region of memory in which the memory error was detected from a system memory map (in step 265). In some embodiments, details of memory error(s) detected during the pre-boot phase may be written to the failed memory data structure (FMDS) 178 stored within NV memory 170.

Returning to FIG. 2, method 200 may create an ACPI Windows Management Instrumentation (WMI) method (in step 270), which enables details of any memory errors detected during OS runtime to be written to a data structure stored within the non-volatile memory component of the IHS. In some embodiments, the ACPI WMI method created in step 270 may enable an OS driver (such as OS filter driver 164) to write details of any memory errors detected during OS runtime to the failed memory data structure (FMDS) 178 stored within NV memory 170.

In some embodiments, method 200 may determine if the current system boot is the first time the IHS has been booted (in step 275). If the current system boot is the first time the IHS has been booted (YES branch of step 275), method 200 may end and the system may continue booting. If the current system boot is not the first boot (NO branch of step 275), method 200 may perform additional steps, in some embodiments. For example, method 200 may read the data structure stored in the non-volatile memory component (e.g., FMDS 178) to determine if any memory errors have been previously detected on one or more pages of memory (in step 280). If the data structure indicates that a memory error exists on one or more pages, method 200 may set the bit(s) corresponding to the page(s) in the MTB (in step 285) and may remove a region of memory in which the memory error was detected from the system memory map (in step 290). Once this is done, method 200 may end and the system may continue booting.

FIG. 4 illustrates one embodiment of a method 400 that may be used for testing a volatile memory component (e.g., system memory 120 or another volatile memory component) of an information handling system (IHS) during OS runtime. It will be recognized that the embodiment shown in FIG. 4 is merely one example of a method that may be used for testing a volatile memory component when the OS is running. In some embodiments, additional steps may be added to, or removed from, the method shown in FIG. 4 as the steps shown and described herein are not intended to be exclusive. Moreover, the order of the steps is not limited to the order shown in FIG. 4, as different orders may occur and/or various steps may be performed in combination or at the same time.

According to one embodiment, method 400 may begin (in step 410) upon receiving a read command during OS runtime for reading data from a computer readable storage device of the IHS into the volatile memory component. If a read command is received (YES branch of step 410), method 400 reads a memory location parameter specified in the read command (in step 420). In some embodiments, the memory location parameter may correspond to one or more pages of memory within the volatile memory component. Prior to writing the data into the one or more pages of memory, method 400 may access a memory test bitmap stored within a non-volatile memory component of the IHS to determine (in step 430) if the one or more pages of memory have already been tested. Each bit in the memory test bitmap may represent one page of memory within the volatile memory component. In this embodiment, the memory test bitmap (e.g., ACPI_MTB) may be stored within an ACPI region of the non-volatile memory component of the IHS.

If the memory test bitmap indicates that the one or more pages of memory have been tested (YES branch of step 430), method 400 may end until the next read command is received (in step 410). In some embodiments, method 400 may store the data read from the computer readable storage device, or may allow the data to be stored, within the one or more pages of memory if the memory test bitmap indicates that the one or more pages of memory have been tested.

If the memory test bitmap indicates that at least one page of the one or more pages of memory has not yet been tested (NO branch of step 430), method 400 may read at least one variable stored within the non-volatile memory component to determine which memory test to run (in step 440). For each page whose corresponding bit in the memory test bitmap (ACPI_MTB) is set to '0', method 400 runs the memory test specified in the at least one variable (in step 450) and sets the bit in the memory test bitmap (ACPI_MTB) corresponding to the page to '1' to indicate that the page has been tested (in step 460).

If no memory errors are detected by the memory test (NO branch of step 470), the method shown in FIG. 4 may end until the next read command is received (in step 410). In some embodiments, method 400 may store the data read from the computer readable storage device, or may allow the data to be stored, within the pages that pass the memory test.

If the memory test detects a memory error on at least one page of memory (YES branch of step 470), method 400 may write details of the memory error to a data structure stored within the non-volatile memory component of the IHS (in step 480). In some embodiments, details of memory error(s) detected during OS runtime may be written to the failed memory data structure (FMDS) 178 stored within NV memory 170 by calling an ACPI WMI method, as described above.

FIG. 5 illustrates another embodiment of a method 500 that may be used for testing a volatile memory component (e.g., system memory 120 or another volatile memory component) of an information handling system (IHS) during OS runtime. The method 500 shown in FIG. 5 differs from the method 400 shown in FIG. 4 by adding method steps that enable event-driven memory testing.

According to one embodiment, method 500 may begin (in step 510) upon detecting an event during OS runtime. In some embodiments, the event detected in step 510 may be a memory error detected during a previous memory test (e.g., when a default memory test was used to test one or more pages of memory). In other embodiments, the event detected in step 510 may be an elapsed period of time, a system failure, or a temperature measurement exceeding or falling below a threshold, for example. If an event is detected (YES branch of step 510), method 500 may reset all bits of the memory test bitmap (e.g., ACPI_MTB) to zero (in step 520), and may select another memory test, which is more aggressive than the default memory test, to perform subsequent memory testing (in step 530). Once another memory test is selected, method 500 may perform the method 400 steps shown in FIG. 4 and discussed above.

It will be understood that one or more of the tasks, functions, or methodologies described herein may be implemented, for example, as firmware or as a computer program of instructions embodied in a non-transitory tangible computer readable medium that is executed by a CPU, embedded controller, microcontroller, processor, microprocessor, FPGA, ASIC, or other suitable processing device.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A computer-implemented method performed by at least one processing device of an information handling system (IHS) for testing a volatile memory component of the IHS during a pre-boot phase of the IHS, wherein the computer-implemented method comprises:
creating a memory test bitmap (MTB) for all memory locations within the volatile memory component during the pre-boot phase before data or program code is stored within the volatile memory component, wherein each bit in the MTB represents one page of memory within the volatile memory component;
initializing all bits of the MTB to zero (0);
performing a memory test on at least one page of memory when the at least one page of memory is first allocated after the IHS is booted; and
setting a bit in the MTB corresponding to the at least one page of memory to one (1) to indicate that the at least one page of memory has been tested.

2. The computer-implemented method as recited in claim 1, wherein said performing a memory test comprises:
determining if the bit in the MTB corresponding to the at least one page of memory is set to zero (0) or one (1) prior to performing the memory test; and
performing the memory test on the at least one page of memory only if the bit is set to zero (0).

3. The computer-implemented method as recited in claim 2, wherein each time one or more pages of memory of the volatile memory component are first allocated after the IHS is booted, the computer-implemented method further comprises repeating the steps of:
performing a memory test on the one or more pages of memory; and
setting one or more bits in the MTB corresponding to the one or more pages of memory to one (1) to indicate that the one or more pages of memory have been tested.

4. The computer-implemented method as recited in claim 1, wherein prior to said performing a memory test, the method further comprises selecting from a plurality of memory tests, a particular memory test to be performed on the at least one page of memory.

5. The computer-implemented method as recited in claim 4, wherein said selecting a particular memory test comprises cycling through a list of memory tests by switching to a next memory test in the list at each subsequent boot.

6. The computer-implemented method as recited in claim 1, wherein prior to said performing a memory test, the computer-implemented method further comprises:
creating one or more variables specifying one or more memory test parameters;
storing the one or more variables within a non-volatile memory component of the IHS; and
using at least one variable of the one or more variables to select a particular memory test from a plurality of memory tests prior to performing the particular memory test on the at least one page of memory.

7. The computer-implemented method as recited in claim 1, wherein if the memory test detects a memory error within the at least one page of memory, the computer-implemented method further comprises:
writing details of the memory error to a data structure stored within a non-volatile memory component of the IHS; and
removing a region of memory in which the memory error was detected from a system memory map.

8. The computer-implemented method as recited in claim 1, further comprising creating an Advanced Configuration and Power Interface (ACPI) table and storing a copy of the MTB within the ACPI table.

9. A computer-implemented method performed by at least one processing device of an information handling system (IHS) for testing a volatile memory component of the IHS during an operating system (OS) runtime, wherein the computer-implemented method comprises:
receiving a read command during OS runtime for reading data from a computer readable storage device of the IHS into the volatile memory component;

reading a memory location parameter specified in the read command, wherein the memory location parameter corresponds to one or more pages of memory within the volatile memory component; and prior to writing the data into the one or more pages of memory, accessing a memory test bitmap stored within a non-volatile memory component of the IHS to determine if the one or more pages of memory have already been tested, wherein each bit in the memory test bitmap represents one page of memory within the volatile memory component;

wherein if the memory test bitmap indicates that at least one page of the one or more pages of memory has not yet been tested, the computer-implemented method further comprises:

performing a memory test on the at least one page of memory; and setting a bit in the memory test bitmap corresponding to the at least one page of memory to indicate that the at least one page of memory has been tested.

10. The computer-implemented method as recited in claim 9, wherein the memory test bitmap is stored within an Advanced Configuration and Power Interface (ACPI) region of the non-volatile memory component of the IHS.

11. The computer-implemented method as recited in claim 9, wherein said accessing the memory test bitmap to determine if the one or more pages of memory have already been tested comprises:

determining that the one or more pages of memory have already been tested if all bits in the memory test bitmap corresponding to the one or more pages of memory is/are set to one (1); and determining that at least one page of the one or more pages of memory has not yet been tested if at least one bit in the memory test bitmap corresponding to the at least one page of memory is set to zero (0).

12. The computer-implemented method as recited in claim 9, further comprising:

reading at least one variable stored within the non-volatile memory component, the at least one variable specifying one or more memory test parameters; and using the at least one variable to select a particular memory test from a plurality of memory tests prior to performing the particular memory test on the at least page of memory.

13. The computer-implemented method as recited in claim 9, wherein if the memory test detects a memory error within the at least one page of memory, the computer-implemented method further comprises writing details of the memory error to a data structure stored within the non-volatile memory component, so that a region of memory in which the memory error was detected will be removed from a system memory map during a subsequent system boot.

14. The computer-implemented method as recited in claim 9, wherein said performing a memory test comprises initially performing a default memory test on the at least one page of memory, and wherein the computer-implemented method further comprises:

detecting an event during OS runtime, wherein the event comprises one of the following: a memory error detected during the default memory test, an elapsed period of time, a system failure, or a temperature measurement exceeding or falling below a threshold;

resetting all bits of the memory test bitmap to zero in response to the detected event; and selecting another memory test, which is more aggressive than the default memory test, to perform subsequent memory testing.

15. An information handling system (IHS), comprising:

at least one processing device;

a volatile memory component comprising physical memory;

a non-volatile memory component comprising boot firmware, wherein after the IHS is booted and before an operating system (OS) of the IHS is loaded, a boot service of the boot firmware is executed by the at least one processing device to:

create a memory test bitmap (MTB) for all physical memory contained within the volatile memory component before the boot firmware is stored within the volatile memory component, wherein each bit in the MTB represents one page of physical memory within the volatile memory component, and wherein each bit is:

set to zero (0) if a corresponding page of physical memory has not yet been tested; and set to one (1) if a corresponding page of physical memory has already been tested; and access the MTB each time a page of physical memory is allocated for the first time to determine if a bit corresponding to the page of physical memory has already been tested.

16. The information handling system as recited in claim 15, wherein if the MTB indicates that the page of physical memory has not yet been tested, the boot service is further executed by the at least one processing device to:

perform a memory test on the page of physical memory; and set a bit in the MTB corresponding to the page of physical memory to indicate that the page of physical memory has been tested;

wherein if the memory test detects a memory error within the page of physical memory, the boot service is further executed by the at least one processing device to:

write details of the memory error to a data structure stored within the non-volatile memory component; and remove a region of memory in which the memory error was detected from a system memory map.

17. The information handling system as recited in claim 15, wherein after the IHS is booted and before an operating system (OS) of the IHS is loaded, the boot service is further executed by the at least one processing device to:

store a copy of the MTB within an Advanced Configuration and Power Interface (ACPI) table stored within an ACPI region of the non-volatile memory component;

store at least one variable specifying at least one memory test parameter within the non-volatile memory component; and create an ACPI Windows Management Instrumentation (WMI) method that enables details of any memory errors detected during OS runtime to be written to a data structure stored within the non-volatile memory component.

18. The information handling system as recited in claim 17, further comprising a computer readable storage device comprising the OS and an OS filter driver, wherein during OS runtime, the OS filter driver is executed by the at least one processing device to:

receive a read command for reading data from the computer readable storage device into the volatile memory component;

read a memory location parameter specified in the read command, wherein the memory location parameter corresponds to at least one page of physical memory within the volatile memory component; and prior to writing the data into the at least one page of physical memory, access the copy of the MTB stored within the non-volatile memory component to determine if the at least one page of physical memory has already been tested.

19. The information handling system as recited in claim 18, wherein if the copy of the MTB indicates that the at least one page of physical memory has not yet been tested, the OS filter driver is further executed by the at least one processing device to:

perform a memory test on the at least one page of physical memory; and set a bit in the copy of the MTB corresponding to the at least one page of physical memory to indicate that the at least one page of physical memory has been tested;

wherein if the memory test detects a memory error within the at least one page of physical memory, the OS filter driver is further executed by the at least one processing device to call the ACPI WMI method to write details of the memory error to a data structure stored within the non-volatile memory component, so that a region of memory in which the memory error was detected will be removed from a system memory map during a subsequent system boot.

20. The information handling system as recited in claim 19, wherein prior to performing the memory test, the OS filter driver is further executed by the at least one processing device to:

read the at least one variable stored within the non-volatile memory component to select a particular memory test from a plurality of memory tests; and perform the particular memory test specified in the at least one variable on the at least one page of physical memory.

* * * * *